United States Patent
Carney et al.

(10) Patent No.: US 10,942,206 B2
(45) Date of Patent: Mar. 9, 2021

(54) VARIABLE PASSIVE INTERMODULATION LOAD

(71) Applicants: Paul A. Carney, New Haven, CT (US); Gordon M. Siebert, New Haven, CT (US); Charles J. Grillo, New Haven, CT (US)

(72) Inventors: Paul A. Carney, New Haven, CT (US); Gordon M. Siebert, New Haven, CT (US); Charles J. Grillo, New Haven, CT (US)

(73) Assignee: Nokia Shanghai Bell Co., Ltd., Shanghai (CN)

( * ) Notice: Subject to any disclaimer, the term of this patent is extended or adjusted under 35 U.S.C. 154(b) by 528 days.

(21) Appl. No.: 14/451,114

(22) Filed: Aug. 4, 2014

(65) Prior Publication Data
US 2016/0033562 A1 Feb. 4, 2016

(51) Int. Cl.
| | |
|---|---|
| *G01R 23/20* | (2006.01) |
| *G01R 31/00* | (2006.01) |
| *H04B 10/69* | (2013.01) |
| *G01R 35/00* | (2006.01) |

(52) U.S. Cl.
CPC ............ *G01R 23/20* (2013.01); *G01R 31/00* (2013.01); *H04B 10/697* (2013.01); *G01R 35/007* (2013.01)

(58) Field of Classification Search
CPC ....... G01R 23/20; G01R 31/00; H04B 10/697
USPC .......... 324/76.11–76.83, 459, 612, 620, 624
See application file for complete search history.

(56) References Cited

U.S. PATENT DOCUMENTS

| | | | | |
|---|---|---|---|---|
| 8,410,786 B1* | 4/2013 | Bradley | ............... | H04B 3/46 324/520 |
| 9,176,180 B1* | 11/2015 | Bradley | ............. | H04B 17/0085 |
| 2003/0030489 A1* | 2/2003 | Park | ........................ | H03F 1/26 330/149 |
| 2003/0232600 A1* | 12/2003 | Montgomery | ......... | H01Q 1/246 455/67.11 |
| 2007/0177525 A1* | 8/2007 | Wijnands | ................ | H04L 12/18 370/254 |
| 2008/0095161 A1* | 4/2008 | Xu | .......................... | H04L 45/16 370/390 |
| 2009/0125253 A1* | 5/2009 | Blair | ...................... | H04L 43/50 702/57 |
| 2009/0154798 A1* | 6/2009 | Mizukura | ............ | H04N 1/6058 382/162 |
| 2010/0085061 A1* | 4/2010 | Bradley | ................ | G01R 31/11 324/520 |

(Continued)

FOREIGN PATENT DOCUMENTS

KR    10-0809511 B1    3/2008

OTHER PUBLICATIONS

KR 10-2006-0127349 machine translation; Dec. 13, 20016.*

(Continued)

*Primary Examiner* — Raul J Rios Russo
(74) *Attorney, Agent, or Firm* — Harness, Dickey & Pierce, P.L.C.

(57) ABSTRACT

In one embodiment, the PIM load includes a variable attenuator; a detector configured to detect a signal characteristic associated with a signal received by the PIM load; and a controller configured to control the variable attenuator based on output from the detector.

17 Claims, 3 Drawing Sheets

(56) References Cited

U.S. PATENT DOCUMENTS

| | | | | |
|---|---|---|---|---|
| 2010/0164504 A1* | 7/2010 | Bradley | ............... | H04B 3/46 |
| | | | | 324/520 |
| 2010/0182246 A1* | 7/2010 | Petschnigg | ........... | G06F 3/0483 |
| | | | | 345/173 |
| 2013/0071112 A1* | 3/2013 | Melester | ............ | H04B 17/0085 |
| | | | | 398/38 |
| 2013/0182753 A1* | 7/2013 | Delforce | ............... | H04B 17/17 |
| | | | | 375/228 |
| 2014/0002097 A1* | 1/2014 | Yagi | ............. | G01R 23/20 |
| | | | | 324/520 |
| 2014/0119197 A1* | 5/2014 | Maca | ............... | H04B 17/327 |
| | | | | 370/241 |
| 2014/0146866 A1* | 5/2014 | Strachan | ............ | H04B 17/309 |
| | | | | 375/226 |
| 2016/0285538 A1* | 9/2016 | Han | ............... | H04B 7/15507 |
| 2017/0257157 A1* | 9/2017 | Han | ............... | H04B 7/15507 |

OTHER PUBLICATIONS

A primer on passive intermodulation (PIM), 9 pages, Apr. 2009.
International Standard IEC 62037-2, Edition 1.0, pp. 1-18 (2012).

* cited by examiner

VARIABLE PASSIVE INTERMODULATION LOAD

BACKGROUND OF THE INVENTION

Passive intermodulation or PIM is the unwanted mixing of two or more signals in a non-linear junction within a system creating additional undesired harmonic signals. In today's radio systems, two or more carriers share not just the same site, but the same cable runs and antenna system, simultaneously, in both the uplink and downlink bands. Problems arise when, for example, downlink signals create PIM in the uplink bands.

Accordingly, tests are conducted to identify and then remove PIM. PIM measurements may be conducted according to IEC standard 62037-2. In this standard, two test tones of 20 W (43 dbm) are used; however, the frequencies of the test tones will be dependent on the specifics of the system being tested.

SUMMARY

At least one embodiment relates to a passive intermodulation (PIM) load.

In one embodiment, the PIM load includes a variable attenuator; a detector configured to detect a signal characteristic associated with a signal received by the PIM load; and a controller configured to control the variable attenuator based on output from the detector.

In one embodiment, the controller is configured to obtain an attenuation level from a look up table using the output from the detector, and the controller is configured to control the variable attenuator based on the obtained attenuation level.

In one embodiment, the PIM load further includes a user interface configured to receive user input indicating desired power level and desired frequency of PIM. Here, the controller is configured to obtain the attenuation level from a look up table using the output from the detector and the user input.

In one embodiment, the user input indicates a frequency of at least one test signal in the received signal.

In one embodiment, the detector is a radio frequency power detector.

In one embodiment, the PIM load includes a fixed attenuator configured to attenuate the received signal by a fixed amount.

For example, the variable attenuator may be configured to attenuate the output from the fixed attenuator, and the detector may be configured to receive the output from the variable attenuator.

In one embodiment, the PIM load includes a signal line configured to carry the received signal; a first directional coupler configured to couple the received signal from the signal line and obtain a first coupled signal; a fixed attenuator configured to attenuate the first coupled signal; and wherein the detector is configured to receive the output from the fixed attenuator.

In one embodiment, the PIM load further includes a PIM generator configured to generate a PIM signal; the variable attenuator is configured to attenuate output from the PIM generator; and a second directional coupler is configured to couple the output from the variable attenuator onto the signal line.

In another embodiment, the passive intermodulation (PIM) load includes a processor configured to control at least one variable element of the PIM load to adjust PIM introduced by the PIM load.

In one embodiment, the PIM load includes a user interface configured to receive a user input indicating a desired frequency and desired level of PIM; and the processor is configured to control the variable element of the PIM load based on the user input.

In one embodiment, the PIM load includes a detector configured to detect a signal characteristic associated with a signal received by the PIM load; and the processor is configured to control the variable element of the PIM load based on the user input and output from the detector.

In one embodiment, the user input indicates a frequency of at least one test signal in the received signal.

In one embodiment, the variable element is a variable attenuator.

At least one embodiment relates to a method.

In one embodiment, the method includes receiving a signal at a passive intermodulation (PIM) load; detecting a signal characteristic associated with the received signal; determining an attenuation amount based on the detected signal characteristic; and controlling a variable attenuator in the PIM load based on the determined attenuation amount.

BRIEF DESCRIPTION OF THE DRAWINGS

The example embodiments will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 1:
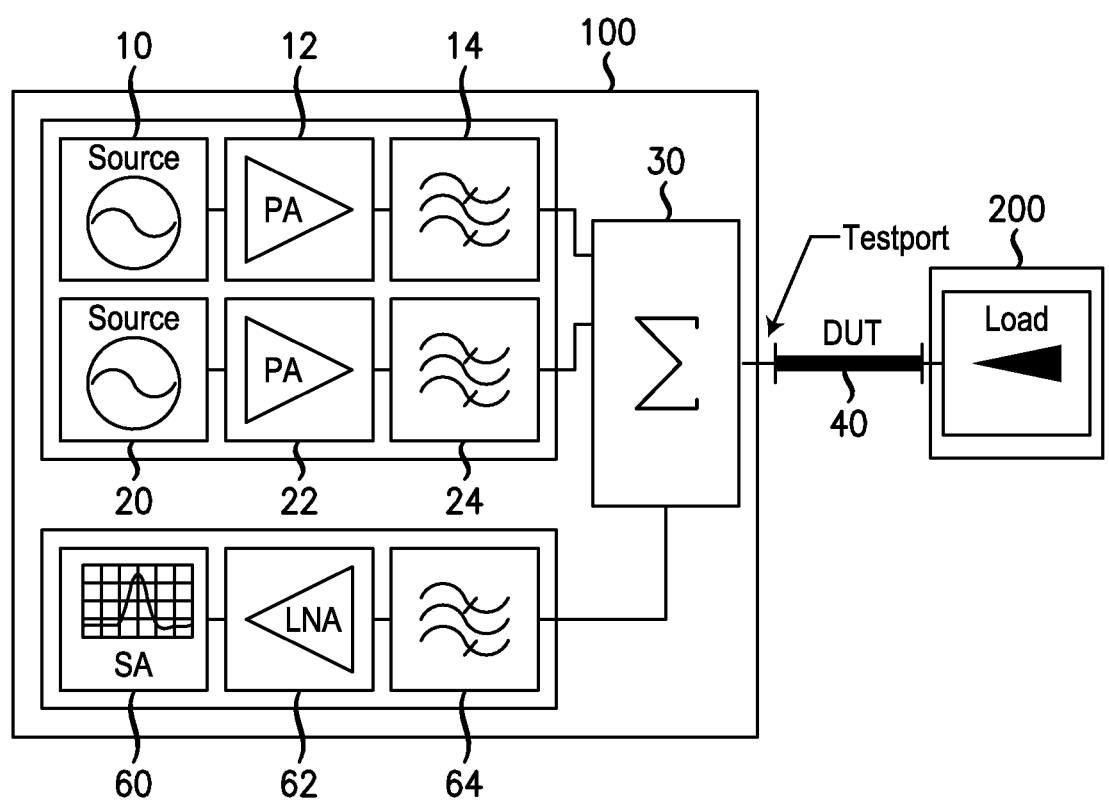
FIG. 1 illustrates an example embodiment of a passive intermodulation (PIM) measurement test set-up.

Various example embodiments will now be described more fully with reference to the accompanying drawings in which some example embodiments are shown.

While example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIG. 1 illustrates an example embodiment of a passive intermodulation (PIM) measurement test set-up. As shown, a test set-up 100 is connected to a device under test (DUT) 40. The test set-up 100 includes a first source 10 that generates a first test signal, a first amplifier 12 that amplifies the first test signal, and a first filter 14 that filters the amplified first test signal. A second source 20 generates a second test signal, a second amplifier 22 amplifies the second test signal, and a second filter 24 filters the amplified second test signal. Accordingly to IEC standard 62037-2, the first and second filtered test signals are 20 W (43 dbm), however, the frequencies of the test tones will be dependent on the specifics of the system being tested. For example, the frequencies of the first and second filtered test signals may be 1930 MHz and 1990 MHz, respectfully. A combiner 30 combines the two filtered test signals, and applies the combined signal to a device under test (DUT) 40. For example, the DUT 40 may be a radio system. The DUT 40 is connected to a PIM load 200. Conventionally, a PIM load would be a fixed load specifically designed for the DUT 40. As will be described with respect to example embodiments below, the PIM load 200 is a dynamic and/or programmable PIM load.

Figure 2:
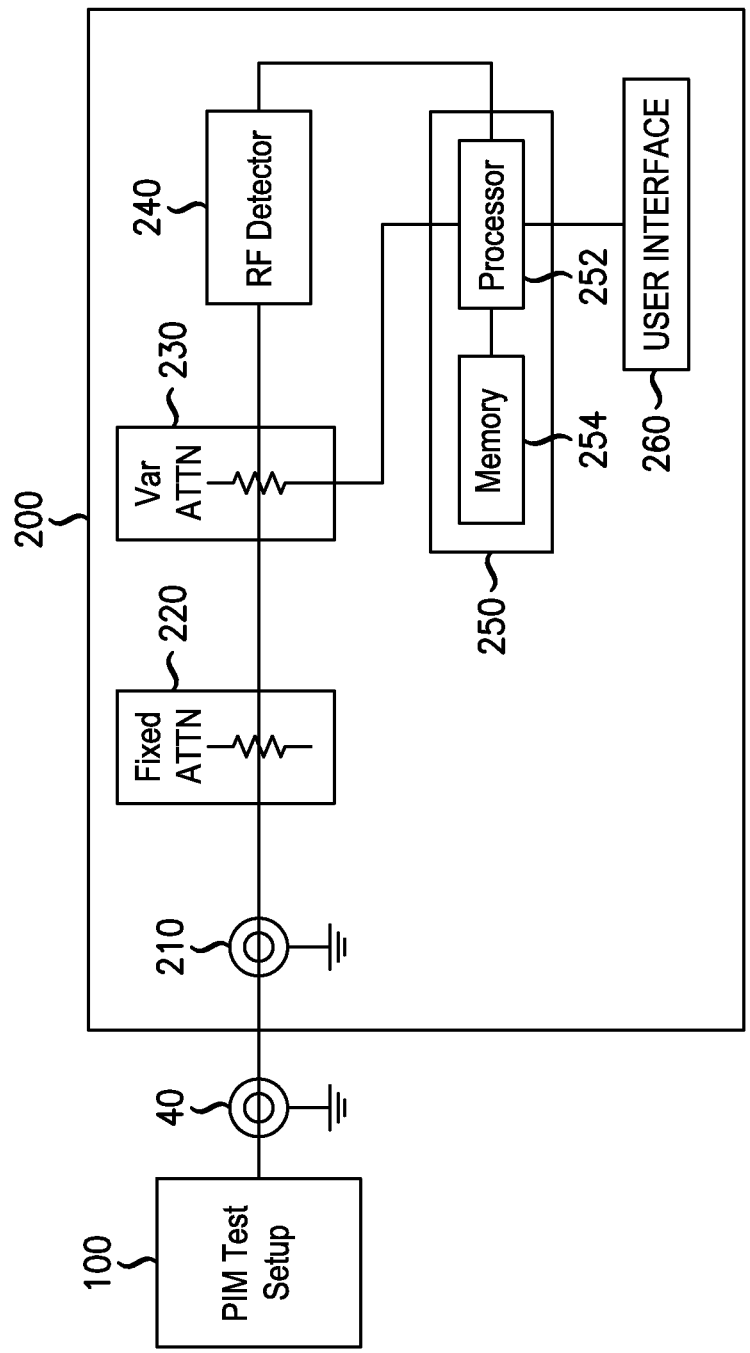
FIG. 2 illustrates an example embodiment of a PIM load.

A reflected signal from the PIM load 200 via the DUT 40 is received at the combiner 30 and supplied to third filter 64. An amplifier 62 amplifies the filtered reflected signal, and a signal analyzer 60 analyzes the PIM in the amplified filtered reflected signal. For example, the signal analyzer 60 analyzes PIM at a desired frequency, for example an uplink frequency, of the DUT 40. For example, when the frequencies of the test signals are 1930 and 1990 MHz, respectively, the signal analyzer 60 may analyze PIM at a frequency of 1870 MHz FIG. 2 illustrates an example embodiment of a PIM load 200. As shown, the PIM load 200 includes an input connector 210, a fixed attenuator 220, a variable attenuator 230, a radio frequency (RF) detector 240, a controller 250, and a user interface 260. The fixed attenuator 220 may be any well-known low PIM fixed attenuator. For example, the fixed attenuator 220 may attenuate the combined signal from the DUT 40 by 40 dbm, and generate a low PIM level of less than −100 dBm.

The variable attenuator 230 receives and attenuates the output from the fixed attenuator 220. The variable attenuator 230 operates under the control of the controller 250, which adjusts the variable attenuator 230 based on output from the RF detector 240. The variable attenuator 230 may be an analog or digital variable attenuator and provides between 0-40 dbm of attenuation. For example, the variable attenuator 230 may be a 7 bit digital attenuator with 0.25 dbm of resolution. A analog variable attenuator 230 may include an digital to analog converter (DAC) to convert the digital input from the processor 252 to analog. Alternatively, the DAC may be external to the variable attenuator 230.

The RF detector 240 detects the power level at different frequencies, and supplies this information to the controller 250. The controller 250 includes a processor 252 and a memory 254. The processor 252 is configured as a special purpose machine to access look-up tables in the memory 254 based on the information from the RF detector 240 and user input received from the user interface 260, and to obtain an attenuation level for the variable attenuator 230. The memory 254 may be any computer readable medium such as on-chip memory, flash memory, memory card, etc.

For example, a user inputs the frequencies of the test signals via the user interface 260, and the user inputs the desired frequency and level (e.g., amount or magnitude) of the PIM signal via the user interface 260. For example, the user interface 260 may include dials, dipswitches, etc. for tuning in these inputs. Additionally or alternatively, the user interface 260 may include a touch screen for tuning in these inputs via a graphical user interface.

Based on the user input, the processor 252 accesses a look up table in the memory 254 using the inputs as an index, and obtains from the look up table a level of attenuation that will produce the desired level of PIM at the desired frequency. As will be appreciated, the look up tables may be determined through empirical study, and the user interface 260 may be configured to accept discrete inputs matching with one of the look up tables. The processor 252 then controls the variable attenuator 230 to attenuate the combined signal according to the obtained attenuation level.

In one embodiment, the controller 250 may initially set the attenuation of the variable attenuator 230 at a default (or, alternatively, predetermined) attenuation level for a period of time following turn on of the PIM load 200. After this calibration period ends, the controller 250 then sets the attenuation of the variable attenuator to a second desired level, which is the level determined from the appropriate look up table, once the calibration period ends. Stated another way, the controller 250 is configured to output a default attenuation level for a period of time before outputting the obtained attenuation level.

As will be appreciated, the attenuation effected by the variable attenuator 230 will produce PIM in the signal reflected back from the variable attenuator 230 to the PIM test set up 100.

Figure 3:
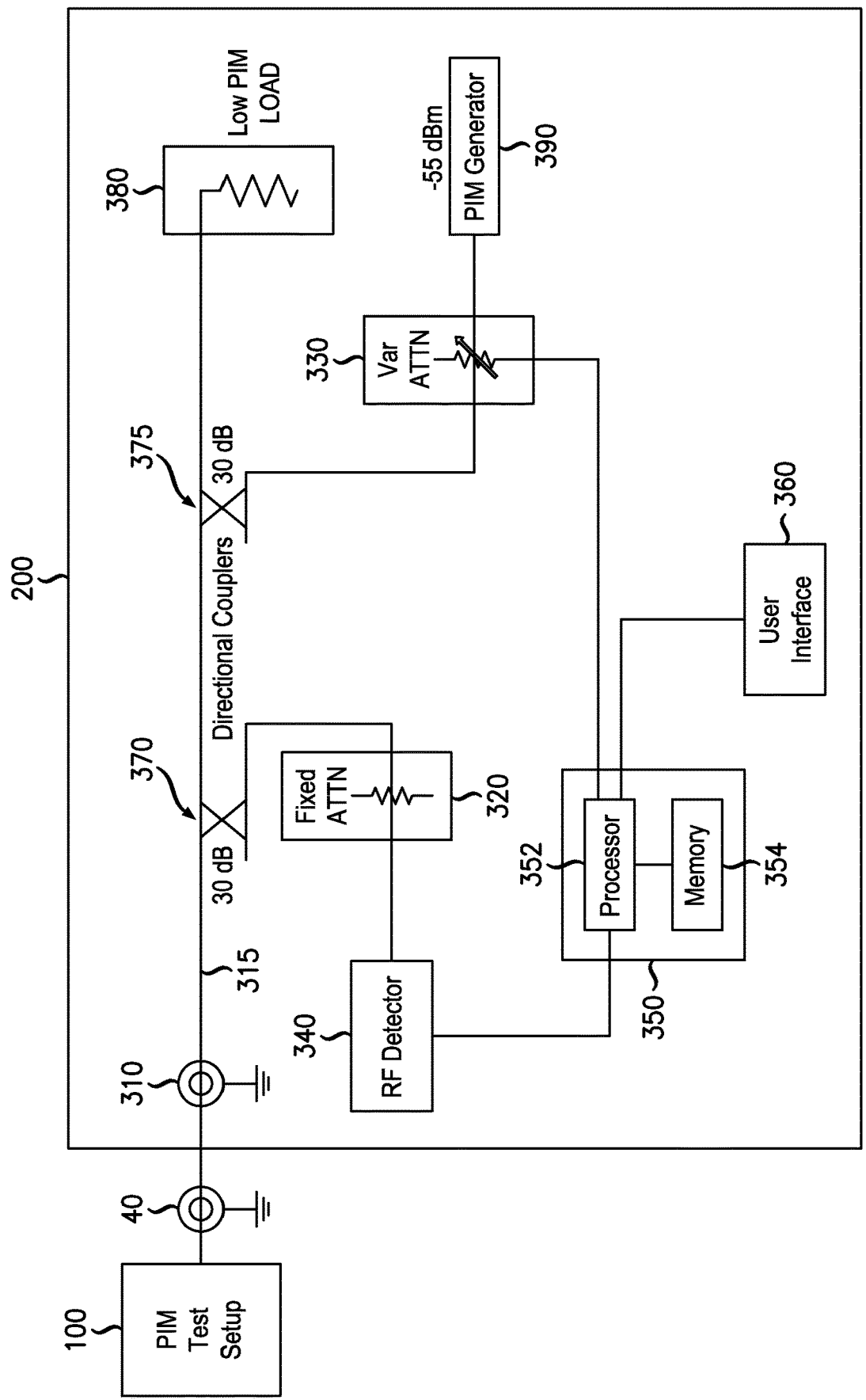
FIG. 3 illustrates another example embodiment of a PIM load.

FIG. 3 illustrates another example embodiment of a PIM load. As shown, the PIM load 200 includes an input connector 310, a transmission line 315, first and second directional couplers 370 and 375, a fixed attenuator 320, a variable attenuator 330, a radio frequency (RF) detector 340, a controller 350, a user interface 360, a low PIM load 380 and a PIM generator 390.

The transmission line 315 is terminated by a low PIM load 380. For example, the low PIM load 380 may be any well-known low PIM fixed load, and may provide a PIM level lower than −115 dbm.

A first directional coupler 370 couples a single off of the transmission line 315 and supplies the coupled signal to the RF detector 340 via the fixed attenuator 320. The first directional coupler 370 may be a 30 db coupler. The fixed attenuator 320 may be any standard attenuator. For example, the fixed attenuator 320 may attenuate the coupled signal by 30 dbm.

The RF detector 340 detects the power level at different frequencies, and supplies this information to the controller 350. The controller 350 includes a processor 352 and a memory 354. The processor 352 is configured as a special purpose machine to access look-up tables in the memory 354 based on the information from the RF detector 340 and user input received from the user interface 360, and to obtain an attenuation level for the variable attenuator 330. The memory 354 may be any computer readable medium such as on-chip memory, flash memory, memory card, etc.

For example, a user inputs the frequencies of the test signals via the user interface 360, and the user inputs the desired frequency and level of the PIM signal via the user interface 360. For example, the user interface 360 may include dials, dipswitches, etc. for tuning in these inputs. Additionally or alternatively, the user interface 360 may include a touch screen for tuning in these inputs via a graphical user interface.

Based on the user input, the processor 352 accesses a look up table in the memory 354 using the inputs as an index, and obtains from the look up table a level of attenuation that will produce the desired level of PIM at the desired frequency. As will be appreciated, the look up tables may be determined through empirical study, and the user interface 360 may be configured to accept discrete inputs matching with one of the look up tables. The processor 352 then controls the variable attenuator 330 according to the obtained attenuation level.

The variable attenuator 330 attenuates a PIM signal generated by the PIM generator 390, and the second directional coupler 375 couples the attenuated PIM signal to the transmission line 315. For example, the PIM generator generates PIM at a desired level (e.g., −55 dbm).

As discussed above, the variable attenuator 330 operates under the control of the controller 350, which adjusts the variable attenuator 330 based on output from the RF detector 340. The variable attenuator 330 may be an analog or digital variable attenuator and provides between 0-40 dbm of attenuation. For example, the variable attenuator 230 may be a 7 bit digital attenuator with 0.25 dbm of resolution. The variable attenuator 330 may include an digital to analog converter (DAC) to convert the digital input from the processor 352 to analog. Alternatively, the DAC may be external to the variable attenuator 330.

As will be appreciated, by coupling the attenuated PIM signal onto the transmission line 315, the attenuation effected by the variable attenuator 330 will produce a desired PIM in the signal reflected back to the PIM test set up 100.

According to the example embodiments, a dynamic or programmable PIM load is provided. Namely, a processor is configured to control at least one variable element (e.g., the variable attenuator) of the PIM load to adjust PIM introduced by the PIM load. As such the power level and frequency of the PIM may be varied. The example embodiments may be applied to numerous and diverse PIM test set-ups and eliminate the need for device specific PIM loads.

The example embodiments being thus described, it will be obvious that the same may be varied in many ways. For example, the signal received by the PIM load could be rectified and used to power the PIM load. Such variations are not to be regarded as a departure from the invention, and all such modifications are intended to be included within the scope of the invention.

What is claimed is:

1. A passive intermodulation (PIM) load, comprising:
a variable attenuator;
a detector configured to detect a signal characteristic associated with a signal received by the PIM load; and
a controller connected to the detector and the variable attenuator, and configured to control the variable attenuator based on output from the detector.

2. The PIM load of claim 1, wherein the controller is configured to obtain an attenuation level from a look up table using the output from the detector, and the controller is configured to control the variable attenuator based on the obtained attenuation level.

3. The PIM load of claim 2, further comprising:
a user interface configured to receive user input indicating desired power level and desired frequency of PIM; and
wherein
the controller is configured to obtain the attenuation level from a look up table using the output from the detector and the user input.

4. The PIM load of claim 3, wherein the user input indicates a frequency of at least one test signal in the received signal.

5. The PIM load of claim 1, wherein the detector is a radio frequency power detector.

6. The PIM load of claim 1, further comprising:
a fixed attenuator configured to attenuate the received signal by a fixed amount.

7. The PIM load of claim 6, wherein the variable attenuator is configured to attenuate output from the fixed attenuator.

8. The PIM load of claim 7, wherein the detector is configured to receive output from the variable attenuator.

9. The PIM load of claim 1, further comprising:
a signal line configured to carry the received signal;
a first directional coupler configured to couple the received signal from the signal line and obtain a first coupled signal;
a fixed attenuator configured to attenuate the first couple signal; and wherein
the detector is configured to receive output from the fixed attenuator.

10. The PIM load of claim 9, further comprising:
a PIM generator configured to generate a PIM signal; and wherein
the variable attenuator is configured to attenuate output from the PIM generator; and
a second directional coupler is configured to couple output from the variable attenuator onto the signal line.

11. The PIM load of claim 1, further comprising:
a PIM generator configured to generate a PIM signal; and wherein
the variable attenuator is configured to attenuate output from the PIM generator; and a directional coupler is configured to couple output from the variable attenuator onto the signal line.

12. A passive intermodulation (PIM) load, comprising:

a processor connected to at least one variable element of the PIM load, and configured to control the at least one variable element of the PIM load to adjust PIM introduced by the PIM load.

13. The PIM load of claim 12, further comprising:

a user interface configured to receive user input indicating a desired frequency and desired level of PIM; and wherein the processor is configured to control the variable element of the PIM load based on the user input.

14. The PIM load of claim 13, further comprising:

a detector configured to detect a signal characteristic associated with a signal received by the PIM load; and wherein the processor is configured to control the variable element of the PIM load based on the user input and output from the detector.

15. The PIM load of claim 13, wherein the user input indicates a frequency of at least one test signal in the received signal.

16. The PIM load of claim 12, wherein the variable element is a variable attenuator.

17. A method, comprising:

receiving a signal at a passive intermodulation (PIM) load;

detecting a signal characteristic associated with the received signal with a detector;

determining an attenuation amount based on the detected signal characteristic; and controlling, with a controller connected to the detector and a variable attenuator, the variable attenuator in the PIM load based on the determined attenuation amount.

* * * * *